(12) United States Patent
 Estrada et al.

(10) Patent No.: US 10,512,162 B2
(45) Date of Patent: Dec. 17, 2019

(54) SYSTEMS AND METHODS FOR STRAIN SENSING USING AEROSOL JET PRINTING OF FLEXIBLE CAPACITIVE STRAIN GAUGES

(71) Applicant: BOISE STATE UNIVERSITY, Boise, ID (US)

(72) Inventors: David Estrada, Boise, ID (US); Jennifer Watkins, Meridian, ID (US); Aline Elquist, Elko, NV (US); Carter Warren, Nampa, ID (US); Preston Riggs, Boise, ID (US); Kiyo Fujimoto, Meridian, ID (US); Harish Subbaraman, Boise, ID (US)

(73) Assignee: BOISE STATE UNIVERSITY, Boise, ID (US)

( * ) Notice: Subject to any disclaimer, the term of this patent is extended or adjusted under 35 U.S.C. 154(b) by 0 days.

(21) Appl. No.: 15/970,380

(22) Filed: May 3, 2018

(65) Prior Publication Data
US 2018/0324948 A1 Nov. 8, 2018

Related U.S. Application Data
(60) Provisional application No. 62/500,852, filed on May 3, 2017.

(51) Int. Cl.
| | |
|---|---|
| *H05K 1/02* | (2006.01) |
| *H05K 3/12* | (2006.01) |
| *H05K 3/14* | (2006.01) |
| *H05K 1/03* | (2006.01) |
| *H05K 1/09* | (2006.01) |

(Continued)

(52) U.S. Cl.
CPC .......... *H05K 1/0393* (2013.01); *H01G 11/36* (2013.01); *H01L 23/5387* (2013.01); *H05K 1/092* (2013.01); *H05K 1/185* (2013.01); *H05K 3/125* (2013.01); *H01G 5/0134* (2013.01); *H05K 1/162* (2013.01); *H05K 1/189* (2013.01); *H05K 2201/10151* (2013.01); *H05K 2203/1344* (2013.01); *H05K 2203/1469* (2013.01)

(58) Field of Classification Search
CPC ........ H05K 3/1241; H05K 3/125; H05K 3/14; H05K 3/143; H05K 3/146; H05K 1/0228
See application file for complete search history.

(56) References Cited

U.S. PATENT DOCUMENTS

| | | |
|---|---|---|
| 9,165,721 B2 | 10/2015 | Lee et al. |
| 2017/0070204 A1 | 6/2017 | McIntyre |

OTHER PUBLICATIONS

Teerapanich et al, "Development and Improvement of Carbon Nanotube-Based Ammonia Gas Sensors Using Ink-Jet Printed Interdigitated Electrodes," IEEE Transactions on Nanotechnology, vol. 12, No. 2, 255-262, Mar. 2013.

(Continued)

*Primary Examiner* — Jeremy C Norris
(74) *Attorney, Agent, or Firm* — Parsons Behle & Latimer

(57) ABSTRACT

A device may include a flexible substrate. The device may further include a flexible integrated circuit within the flexible substrate, the integrated circuit having at least one input electrode positioned on a surface of the flexible substrate. The device may also include an aerosol jet printed conductive ink layer disposed on the surface of the flexible substrate, the aerosol-jet printed conductive ink layer having a pattern that includes a first set of fingers interdigitated with a second set of fingers, the aerosol jet printed conductive ink layer in contact with the at least one input electrode.

20 Claims, 4 Drawing Sheets

(51) Int. Cl.

| | | |
|---|---|---|
| *H01G 11/36* | (2013.01) | |
| *H01L 23/538* | (2006.01) | |
| *H05K 1/18* | (2006.01) | |
| *H05K 1/16* | (2006.01) | |
| *H01G 5/013* | (2006.01) | |

(56) References Cited

OTHER PUBLICATIONS

Yan et al, "Enhanced magnetoelectric effect in longitudinal-longitudinal mode laminate with cofired interdigitated electrodes" Applied Physics Letters, 104.3, 032911, Jan. 24, 2014.

Blumenthal et al, "Conformal printing of sensors on 3D and flexible surfaces using Aerosol Jet deposition" Nanosensors, Biosensors, and Info-Tech Sensors and Systems 2013. vol. 8691. International Society for Optics and Photonics, 2013.

Hu et al, "Development of 3D carbon nanotube interdigitated finger electrodes on polymer substrate for flexible capacitive sensor application," Nanotechnology 24 444006, Oct. 10, 2013.

SYSTEMS AND METHODS FOR STRAIN SENSING USING AEROSOL JET PRINTING OF FLEXIBLE CAPACITIVE STRAIN GAUGES

CROSS-REFERENCE TO RELATED APPLICATIONS

This application claims priority to and the benefit of U.S. Provisional Patent Application Ser. No. 62/500,852 filed on May 3, 2017, and entitled "Strain Sensing Using Aerosol Jet Printing of Flexible Capacitive Strain Gauges," the contents of which are hereby incorporated by reference herein.

GOVERNMENT LICENSE RIGHTS

This invention was made with Government support under contract number NNX15AK35A awarded by NASA. The Government has certain rights in the invention.

FIELD OF THE DISCLOSURE

This disclosure is generally related to the field of flexible capacitive strain gauges, and more particularly to strain sensing using aerosol jet printing of flexible capacitive strain gauges.

BACKGROUND

In some applications, such as space travel and flight, it may be desirable to use high strength fabric materials for structural elements. These materials may reduce a launch or take-off weight and may reduce costs associated with take-off. Two applications where fabric structures are of particular interest are inflatable habitats and parachutes.

Having a knowledge of strain applied to a material during testing and flight is important for both inflatable structures and parachutes. Capacitive strain gauges are useful for long term use because capacitance measurements do not deviate over time, and hysteresis does not appear due to cycling load. However, typical capacitive strain gauges are designed for metal or other rigid materials and may rely on processes such as etching. Flexible materials may exhibit high rates of strain which may cause typical strain gauges to break or malfunction. Ink jet printing has been used to form strain gauges, however, ink jet printing may not enable the strain gauge to have sufficient resolution for many applications. Likewise, typical printing methods may not enable the usage of some conductive inks based on their viscosities.

An additional shortcoming of typical strain gauges is that integrated circuits incorporated in the strain gauge may be subject to failure upon being subjected to excessive strain and/or flexing. Other disadvantages may exist.

SUMMARY

Disclosed are embodiments of strain gauge devices that overcome at least one of the shortcomings of typical strain gauges described above. In an embodiment a device includes a flexible substrate. The device further includes a flexible integrated circuit within the flexible substrate, the integrated circuit having at least one input electrode positioned on a surface of the flexible substrate. The device also includes an aerosol-jet printed conductive ink layer disposed on the surface of the flexible substrate, the aerosol jet printed conductive ink layer having a pattern that includes a first set of fingers interdigitated with a second set of fingers, the aerosol-jet printed conductive ink layer in contact with the at least one input electrode.

In some embodiments, the device further includes a structure, where the flexible substrate is attached to the structure to enable a capacitance between the first set of fingers and the second set of fingers to change based on strain along the structure. In some embodiments, the structure is a rigid structure. In some embodiments, the flexible structure is a fabric barrier of an inflatable habitat or a parachute. In some embodiments, the flexible integrated circuit is configured to a detect changes in capacitance between the first set of fingers and the second set of fingers. In some embodiments, the flexible integrated circuit is configured to associate the changes in capacitance with a measure of strain associated with a structure. In some embodiments, the conductive ink layer includes a metallic nano-particle material, a conductive 1-dimensional material, a conductive 2-dimensional material, or combinations thereof.

In an embodiment, a method includes providing a flexible substrate having a flexible integrated circuit with at least one input electrode positioned on a surface of the flexible substrate. The method further includes aerosol jet printing a conductive ink layer onto the surface of the flexible substrate, the conductive ink layer having a pattern that includes a first set of fingers interdigitated with a second set of fingers. The method also includes applying a portion of the conductive ink layer to the at least one input electrode.

In some embodiments, the method includes attaching the flexible substrate to a structure to enable a capacitance between the first set of fingers and the second set of fingers to change based on strain along the structure. In some embodiments, the method includes conforming a shape of the flexible substrate to a rigid surface of the structure. In some embodiments, the method includes conforming a shape of the flexible substrate to a flexible surface of the structure. In some embodiments, the flexible surface is a fabric barrier of an inflatable habitat or a parachute. In some embodiments, the method includes detecting changes in capacitance between the first set of fingers and the second set of fingers at the flexible integrated circuit. In some embodiments, the method includes associating the changes in capacitance with a level of strain associated with a structure. In some embodiments, the conductive ink comprises aerosol printing a metallic nano-particle material, a conductive 1-dimensional material, a conductive 2-dimensional material, or a combination thereof.

In an embodiment, a system includes a flexible substrate. The system further includes a flexible integrated circuit within the flexible substrate, the integrated circuit having at least one input electrode positioned on a surface of the flexible substrate; the system also includes an aerosol jet printed conductive ink layer disposed on the surface of the flexible substrate, the aerosol jet printed conductive ink layer having a pattern that includes a first set of fingers interdigitated with a second set of fingers, the aerosol jet printed conductive ink layer in contact with the at least one input electrode. The system includes a structure, the flexible substrate attached to the structure to enable a capacitance between the first set of interdigitated fingers and the second set of interdigitated fingers to change based on strain along the structure.

In some embodiments, the flexible integrated circuit is configured to detect changes in capacitance between the first set of interdigitated fingers and the second set of interdigitated fingers. In some embodiments, the flexible integrated circuit is configured to associate the changes in capacitance with a measure of strain associated with the structure. In some embodiments, the structure is a rigid structure with a conformal surface or a flexible structure.

Figure 1:
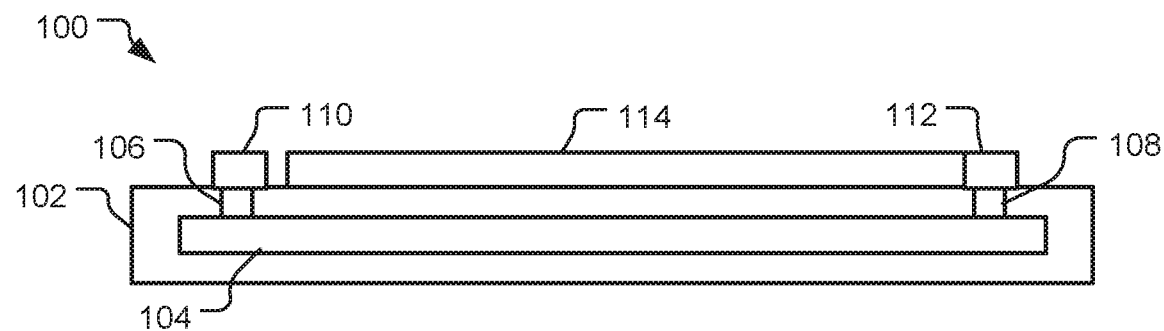
FIG. 1 depicts a cross section of an embodiment of a strain gauge device.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Referring to FIG. 1, a strain gauge device 100 is depicted. The device 100 may include a flexible substrate 102. A flexible integrated circuit 104 may be positioned within the flexible substrate 102. The flexible integrated circuit 104 may include an input electrode 106 which may be positioned on a surface of the flexible integrated circuit 104 and may extend through the substrate 102 to a main portion of the flexible integrated circuit 104. The flexible integrated circuit 104 may further include a second input electrode 108 extending through the substrate 102 to the main portion of the flexible integrated circuit 104. Although FIG. 1 only depicts two input electrodes, in practice, the device 100 may include any number of input and output electrodes for communicating with the flexible integrated circuit 104.

The flexible integrated circuit 104 may be implemented using flexible integrated circuit fabrication methods and may include circuitry for performing functions as described herein. In some embodiments, the flexible integrated circuit may include logic circuitry. Alternatively or additionally, the flexible integrated circuit 104 may include a processor and corresponding memory.

The device 100 may include an aerosol jet printed conductive ink layer 114. A first portion 110 of the conductive ink layer 114 may overlap and be in contact with the first input electrode 106. Likewise, a second portion 112 of the of the conductive ink layer 114 may overlap and be in contact with the second input electrode 108. The conductive ink layer 114 may include metallic nano-particles, conductive 1-dimensional, conductive 2-dimensional materials, or combinations thereof. For example, the conductive ink layer 114 may include silver ink, silver nanowires, carbon nanotubes, and graphene.

As used herein, being aerosol jet printed, the conductive ink layer 114 may differ structurally from other types of printed layers, such as an ink jet printed layer, or an etched layer. For example, an ink jet printed conductive layer may include ink printing anomalies, such as juts or waves, along an edge of the layer. In contrast, an aerosol printed conductive layer omits these anomalies. Further, an aerosol jet printed layer may have a steeper sloping edge than that of an ink jet printed conductive layer. For example, an edge of an aerosol printed layer may gradually increase over a distance on the order of 0.5 to 1.5 microns while an edge of an ink jet printed layer may increase over a distance on the order of 2 to 5 microns. Other structural differences between aerosol jet printed layers and ink jet printed layers may exist. As such, persons of ordinary skill in the art would interpret the term "aerosol jet printed" as denoted a structural distinction from other types of printed layers.

Figure 2:
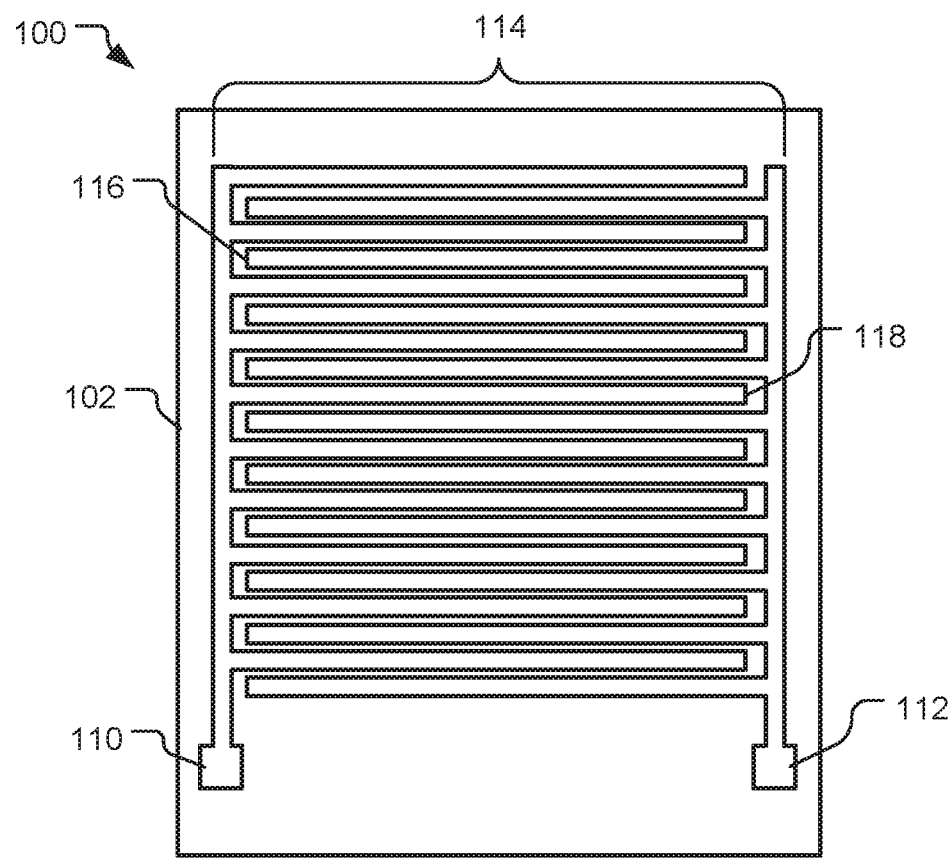
FIG. 2 depicts a top view of an embodiment of a strain gauge device.

Referring to FIG. 2, a top view of an embodiment of a strain gauge device 100 is depicted. The device 100 may include the substrate 102 with the aerosol jet printed conductive ink layer 114. As shown in FIG. 2, the conductive ink layer 114 may have a pattern that includes a first set of fingers 116 interdigitated with a second set of fingers 118. The portions 110, 112 of the aerosol jet printed conductive ink layer 114 may cover the input electrodes 106, 108 (shown in FIG. 1). It should be noted that the pattern of the jet printed conductive ink layer 114 shown in FIG. 2 may not be drawn to scale in order to facilitate visualization of the pattern. In an embodiment, the first set of fingers 116 and the second set of fingers 118 are spaces 25 μm apart and 50 μm from their respective "backbones" (i.e., the vertical portions of the aerosol jet printed conductive ink layer 114 extending upward from the portions 110, 112). A width of the first set of fingers 116 and the second set of fingers 118 may be 50 μm. Additionally, other patterns, or configurations, of the fingers 116, 118 are possible.

During operation, the flexible integrated circuit 104 may detect changes in capacitance between the first set of fingers 116 and the second set of fingers 118. The flexible integrated circuit 104 may then associated the changes in capacitance with a measure of strain associated with a structure. Further, the orientation of the aerosol jet printed conductive ink layer 114 may enable strain measurement in both horizontally (x-direction) and vertically (y-direction). As the distance between the fingers changes, so does the capacitance, enabling strain readings to be taken. A theoretical capacitance associated with the aerosol jet printed conductive ink layer 114 may be given by the following equation:

$$C_{theoretical} = \frac{\varepsilon_0 \varepsilon_r L_{finger\ length} H_{finger\ height}}{t_{finger\ spacing}}$$

In an embodiment, the theoretical capacitance may be $5.72 \times 10^{-13}$ F.

In a particular example embodiment, the aerosol jet printed conductive ink layer 114 was printed on a 125 μm polymide film having an ultimate tensile strength of 207 MPa, a Young's modulus of 2.48 GPa, and an ultimate elongation of 82%. In the example embodiment, a nanosilver conductive ink with a 1:3 ratio of water to silver ink from 40% stock concentration was used. Further, in the example, a material with a relative dielectric constant of $\varepsilon_r=4.9$ was drop cast over the aerosol jet printed conductive ink layer 114. The resulting sensor was adhered to kevlar straps, which were then placed under strain while the gauges were tested. This example embodiment is non-limiting and other materials, quantities, and configurations may be used.

The strain gauge showed a linear capacitance response to increasing strain, and could be strained in both the x- and y-directions. The strain gauge also maintained its integrity after 20 cycles of loading and unloading at various strains, depending on the type of adhesive used to attach them to the kevlar. Reliable strain readings were obtained for up to 40 minutes.

A benefit associated with the device 100 is that it may be more resistant to strain and flexing than typical strain gauges. Further, because the structure of the aerosol jet printed conductive ink layer 114 may have a higher resolution than typical strain gauges, the device 100 may be smaller than typical strain gauges. Other advantages may exist.

Figure 3:
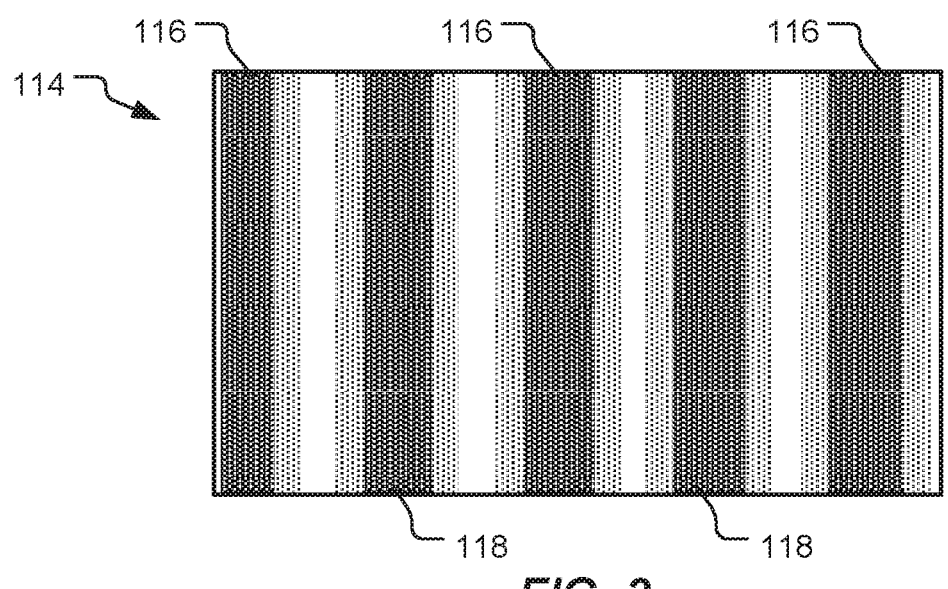
FIG. 3 depicts a detailed view of an embodiment of multiple sets of interdigitated fingers of a strain gauge apparatus.

Referring to FIG. 3, a detailed view of an embodiment of multiple sets 116, 118 of interdigitated fingers of an aerosol jet printed conductive ink layer 114 is depicted. FIG. 3 may highlights the structural differences between ink jet printed layers and aerosol jet printed layers. For example, as shown in FIG. 3, the first set of fingers 116 and the second set of fingers 118 may include some overspray as a result of the aerosol jet process. However, the fingers 116, 118 may omit inconsistencies such as juts and waves. Benefits of aerosol printing are that patterns, such as the aerosol jet printed conductive ink layer 114, may be printed at a resolution that is 10 times greater than ink jet methods. Further, aerosol jet printing may be used on a wider range of substrates. Aerosol jet printing may be used for 2D and 3D printing. Aerosol jet printing may accommodate a wider range of ink viscosities. Other benefits may exist.

Figure 4:
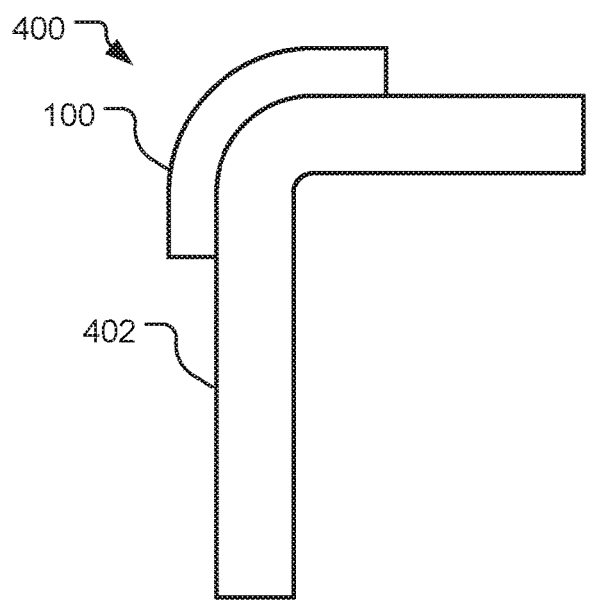
FIG. 4 depicts an embodiment of a system for measuring strain.

Referring to FIG. 4, an embodiment of a system 400 for measuring strain is depicted. The system 400 may include the device 100 and a structure 402, where the flexible substrate is attached to the structure 402. The attachment may enable a capacitance (e.g., between the first set of fingers 116 and the second set of fingers 118 (shown in FIG. 2)) to change based on strain along the structure 402. For example, the device 100 may be conformed to a curved surface of the structure 402. As shown in FIG. 4, the structure 402 may include a rigid structure.

Figure 5:
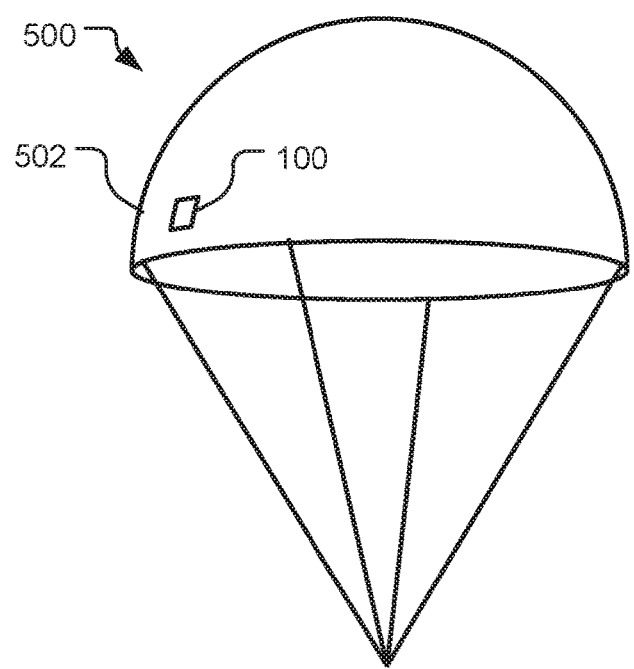
FIG. 5 depicts an embodiment of a system for measuring strain.

Referring to FIG. 5, an embodiment of a system 500 for measuring strain. The system 500 may include the device 100 and a structure 502, where the flexible substrate is attached to the structure 502. The attachment may enable a capacitance (e.g., between the first set of fingers 116 and the second set of fingers 118 (shown in FIG. 2)) to change based on strain along the structure 502. As shown in FIG. 5, the structure 502 may include a parachute. The device 100 may be flexed to conform with a flexible surface of the parachute.

Figure 6:
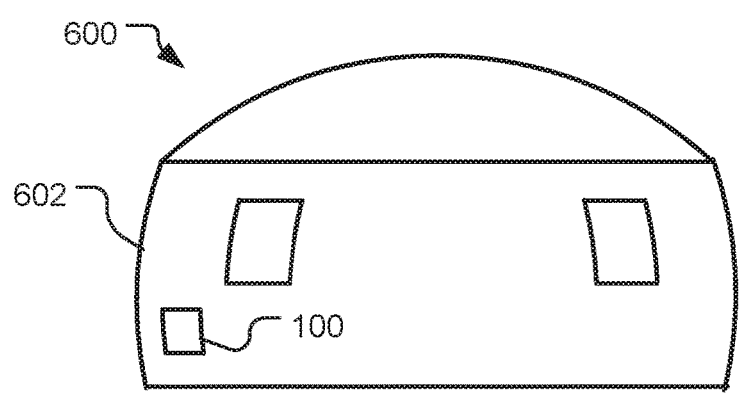
FIG. 6 depicts an embodiment of a system for measuring strain.

Referring to FIG. 6, an embodiment of a system 600 for measuring strain. The system 600 may include the device 100 and a structure 602, where the flexible substrate is attached to the structure 602. The attachment may enable a capacitance (e.g., between the first set of fingers 116 and the second set of fingers 118 (shown in FIG. 2)) to change based on strain along the structure 602. As shown in FIG. 6, the structure 602 may include an inflatable habitat. The device 100 may be flexed to conform with a flexible surface of the habitat.

Figure 7:
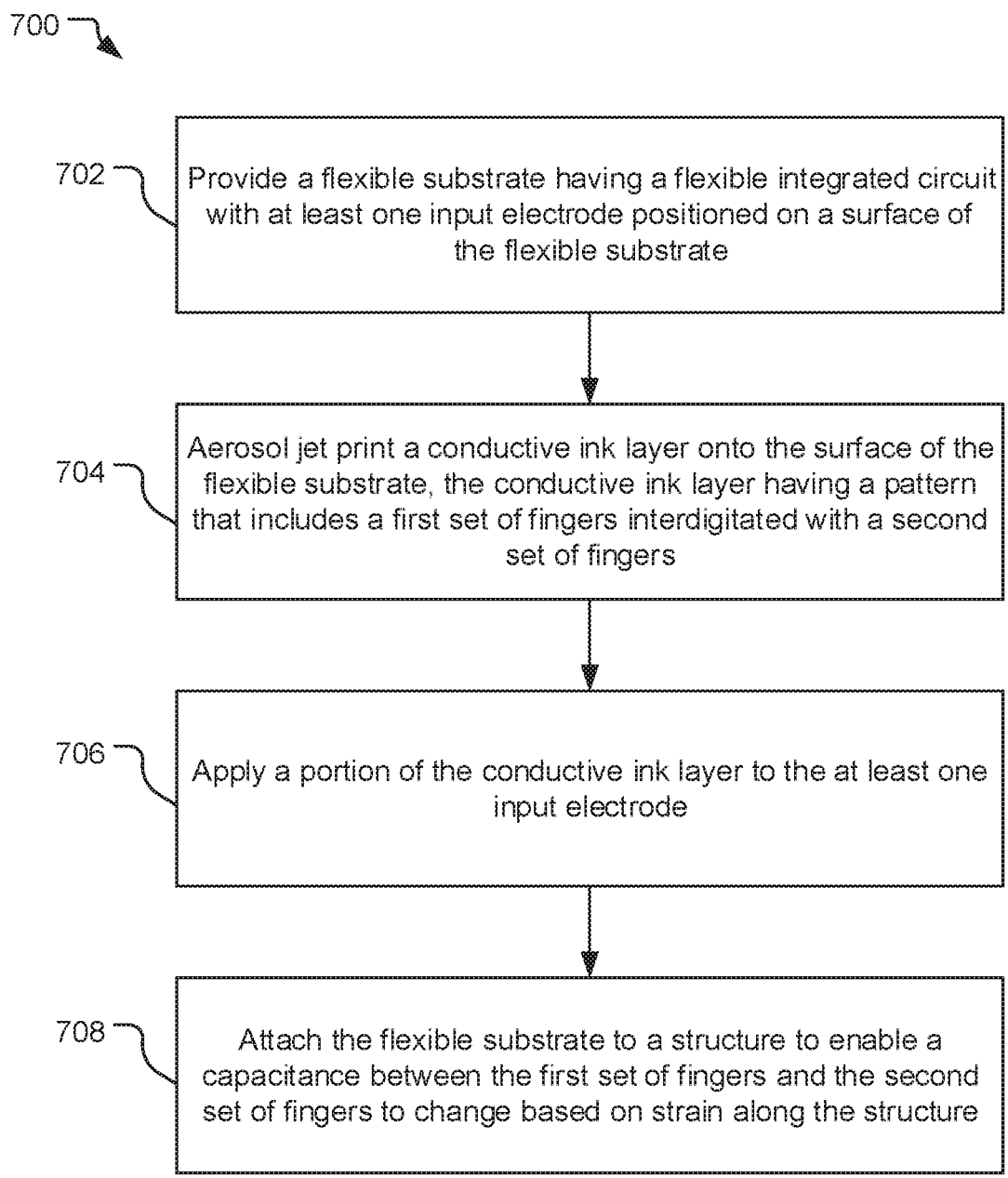
FIG. 7 depicts a method for strain sensing using aerosol jet printing of flexible capacitive strain gauges.

Referring to FIG. 7, an embodiment of a method 700 for strain sensing using aerosol jet printing of flexible capacitive strain gauges is depicted. The method 700 may include providing a flexible substrate having a flexible integrated circuit with at least one input electrode positioned on a surface of the flexible substrate, at 702. For example, the flexible substrate 102 may have the flexible integrated circuit 104 incorporated therein.

The method 700 may further include aerosol jet printing a conductive ink layer onto the surface of the flexible substrate, the conductive ink layer having a pattern that includes a first set of fingers interdigitated with a second set of fingers, at 704. For example, the conductive ink layer 114 may be printed onto the flexible substrate 102.

The method 700 may also include applying a portion of the conductive ink layer to the at least one input electrode, at 706. For example, the portion 110 of the conductive ink layer 114 may be applied to the input electrode 106.

The method 700 may include attaching the flexible substrate to a structure to enable a capacitance between the first set of fingers and the second set of fingers to change based on strain along the structure, at 708. For example, flexible substrate 102 may be attached to the structure 402, the structure 502, or the structure 602.

Although various embodiments have been shown and described, the present disclosure is not so limited and will be understood to include all such modifications and variations as would be apparent to one skilled in the art.

What is claimed is:

1. A device comprising:
    a flexible substrate;
    a flexible integrated circuit within the flexible substrate, the integrated circuit having at least one input electrode positioned on a surface of the flexible substrate; and
    an aerosol-jet printed conductive ink layer disposed on the surface of the flexible substrate, the aerosol jet printed conductive ink layer having a pattern that includes a first set of fingers interdigitated with a second set of fingers, the aerosol-jet printed conductive ink layer in contact with the at least one input electrode.

2. The device of claim 1, further comprising:
    a structure, wherein the flexible substrate is attached to the structure to enable a capacitance between the first set of fingers and the second set of fingers to change based on strain along the structure.

3. The device of claim 2, wherein the structure is a rigid structure.

4. The device of claim 2, wherein the structure is a flexible structure.

5. The device of claim 4, wherein the flexible structure is a fabric barrier of an inflatable habitat or a parachute.

6. The device of claim 1, wherein the flexible integrated circuit is configured to a detect changes in capacitance between the first set of fingers and the second set of fingers.

7. The device of claim 6, wherein the flexible integrated circuit is further configured to associate the changes in capacitance with a measure of strain associated with a structure.

8. The device of claim 1, wherein the conductive ink layer includes a metallic nano-particle material, a conductive 1-dimensional material, a conductive 2-dimensional material, or combinations thereof.

9. A method comprising:
    providing a flexible substrate having a flexible integrated circuit with at least one input electrode positioned on a surface of the flexible substrate; and
    aerosol jet printing a conductive ink layer onto the surface of the flexible substrate, the conductive ink layer having a pattern that includes a first set of fingers interdigitated with a second set of fingers;
    applying a portion of the conductive ink layer to the at least one input electrode.

10. The method of claim 9, further comprising:
attaching the flexible substrate to a structure to enable a capacitance between the first set of fingers and the second set of fingers to change based on strain along the structure.

11. The method of claim 10, further comprising:
conforming a shape of the flexible substrate to a rigid surface of the structure.

12. The method of claim 10, further comprising:
conforming a shape of the flexible substrate to a flexible surface of the structure.

13. The method of claim 10, wherein the flexible surface is a fabric barrier of an inflatable habitat or a parachute.

14. The method of claim 9, further comprising:
detecting changes in capacitance between the first set of fingers and the second set of fingers at the flexible integrated circuit.

15. The method of claim 14, further comprising:
associating the changes in capacitance with a level of strain associated with a structure.

16. The method of claim 9, wherein aerosol printing the conductive ink comprises aerosol printing a metallic nanoparticle material, a conductive 1-dimensional material, a conductive 2-dimensional material, or a combination thereof.

17. A system comprising:
a flexible substrate;
a flexible integrated circuit within the flexible substrate, the integrated circuit having at least one input electrode positioned on a surface of the flexible substrate;
an aerosol-jet printed conductive ink layer disposed on the surface of the flexible substrate, the aerosol jet printed conductive ink layer having a pattern that includes a first set of fingers interdigitated with a second set of fingers, the aerosol-jet printed conductive ink layer in contact with the at least one input electrode; and
a structure, the flexible substrate attached to the structure to enable a capacitance between the first set of interdigitated fingers and the second set of interdigitated fingers to change based on strain along the structure.

18. The system of claim 17, wherein the flexible integrated circuit is configured to a detect changes in capacitance between the first set of interdigitated fingers and the second set of interdigitated fingers.

19. The system of claim 18, wherein the flexible integrated circuit is further configured to associate the changes in capacitance with a measure of strain associated with the structure.

20. The system of claim 19, wherein the structure is a rigid structure with a conformal surface or a flexible structure.

* * * * *